United States Patent
Jeon et al.

(10) Patent No.: US 9,934,854 B2
(45) Date of Patent: Apr. 3, 2018

(54) MEMORY CONTROLLERS COMPARING A DIFFERENCE BETWEEN MEASURED VOLTAGES WITH A REFERENCE VOLTAGE DIFFERENCE

(71) Applicant: HEWLETT PACKARD ENTERPRISE DEVELOPMENT LP, Houston, TX (US)

(72) Inventors: Yoocharn Jeon, Palo Alto, CA (US); James S. Ignowski, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,074

(22) PCT Filed: Nov. 14, 2014

(86) PCT No.: PCT/US2014/065606
§ 371 (c)(1),
(2) Date: Jan. 30, 2017

(87) PCT Pub. No.: WO2016/076879
PCT Pub. Date: May 19, 2016

(65) Prior Publication Data
US 2017/0249987 A1 Aug. 31, 2017

(51) Int. Cl.
*G11C 13/00* (2006.01)

(52) U.S. Cl.
CPC ........ *G11C 13/004* (2013.01); *G11C 13/0007* (2013.01); *G11C 13/0023* (2013.01);
(Continued)

(58) Field of Classification Search
CPC ............................................ G11C 2013/0045
(Continued)

(56) References Cited

U.S. PATENT DOCUMENTS 6,707,712 B2  3/2004 Lowery
7,302,513 B2  11/2007 Mouttet
(Continued)

FOREIGN PATENT DOCUMENTS

WO  WO-2013154564 A1  10/2013
WO  WO-2014018063     1/2014

OTHER PUBLICATIONS

International Searching Authority, The International Search Report and the Written Opinion, PCT/US2014/065606, dated Jul. 24, 2015, 10 Pages.

(Continued)

*Primary Examiner* — Son Mai
(74) *Attorney, Agent, or Firm* — Fabian VanCott (57) ABSTRACT

A memory controller includes a voltage driver and a voltage comparator. The voltage driver applies a variable voltage to a selected line of a crossbar array to determine a first measured voltage that drives a first read current through a selected memory cell of the crossbar array. The voltage driver applies the variable voltage to the selected line to determine a second measured voltage that drives a second read current through the selected memory cell. The voltage comparator then determines a voltage difference between the first measured voltage and the second measured voltage and to compare the voltage difference with a reference voltage difference to determine a state of the selected memory cell. The crossbar array comprises a plurality of row lines, a plurality of column lines, and a plurality of memory cells. Each memory cell is coupled between a unique combination of one row line and one column line.

20 Claims, 5 Drawing Sheets (52) U.S. Cl.
    CPC ............ *G11C 2013/0045* (2013.01); *G11C 2013/0054* (2013.01)

(58) Field of Classification Search
    USPC ......................................... 365/148
    See application file for complete search history.

(56) References Cited

U.S. PATENT DOCUMENTS

| | | | |
|---|---|---|---|
| 7,848,138 | B2 | 12/2010 | Bedeschi et al. |
| 8,467,253 | B2* | 6/2013 | Perner .............. G11C 5/063 365/148 |
| 9,064,568 | B2* | 6/2015 | Perner .............. G11C 13/0007 |
| 9,123,430 | B2* | 9/2015 | Cernea .............. G11C 16/28 |
| 2004/0090852 | A1 | 5/2004 | Smith et al. |
| 2010/0103728 | A1* | 4/2010 | Zhu .............. G11C 11/16 365/171 |
| 2011/0182104 | A1 | 7/2011 | Kim et al. |
| 2012/0153249 | A1* | 6/2012 | Zhang .............. H01L 45/08 257/4 |
| 2012/0230081 | A1* | 9/2012 | Close .............. G11C 5/147 365/148 |
| 2012/0250395 | A1 | 10/2012 | Nodin |
| 2013/0010521 | A1 | 1/2013 | Carter |
| 2014/0198559 | A1 | 7/2014 | Perner |
| 2015/0358151 | A1* | 12/2015 | You .............. H01L 45/08 380/287 |
| 2016/0005463 | A1* | 1/2016 | Park .............. G11C 13/0021 365/148 |

OTHER PUBLICATIONS

Wong, H.S.P. et al., Phase Change Memory, Proceedings of the IEEE, Dec. 2010, vol. 98, No. 12, pp. 2201-2227.

\* cited by examiner

MEMORY CONTROLLERS COMPARING A DIFFERENCE BETWEEN MEASURED VOLTAGES WITH A REFERENCE VOLTAGE DIFFERENCE

BACKGROUND

Memory controllers are devices that can operate a memory device, such as memristor-based memories. Memristor-based memories may involve crossbar arrays of memristors. Memristors are devices that can be programmed to different resistive states by applying a programming energy, such as a voltage. After programming, the state of the memristor can be read and remains stable over a specified time period. Thus, memristors can be used to store digital data. For example, a high resistance state can represent a digital "0" and a low resistance state can represent a digital "1." Large crossbar arrays of memristive elements can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein.

DETAILED DESCRIPTION

Memristors are devices that may be used as components in a wide range of electronic circuits, such as memories, switches, radio frequency circuits, and logic circuits and systems. In a memory structure, a crossbar array of memory cells with memristors or other memory devices may be used. When used as a basis for memories, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("ON") and one in which the channel forms a less conductive path ("OFF"). In some other cases, conductive paths represent "OFF" and less conductive paths represent "ON". Conducting channels may be formed by ions and/or vacancies.

Using memristors or memory cells in crossbar arrays may lead to read and/or write failure due to sneak currents passing through the cells that are not selected—for example, cells on the same row or column as a targeted cell. Failure may arise when the variation of the total sneak current through untargeted neighboring cells from an applied voltage is larger than the difference in the current of the targeted memory cell between the high- and low-resistance states. Therefore, selectors, or nonlinear memristors, have been used to isolate each cell and overcome the sneak current. A selector may be nonlinear or may have a threshold voltage, which may be the minimum voltage that may activate the selector. In other words, the application of a voltage that is equal or larger than a threshold voltage of a selector will switch the selector from an insulating state to a conducting state.

Furthermore, memory cells may have a write voltage, which is the voltage that need be applied in order to switch a memory cell from a first state to a second state. In some examples, the write voltage of a memory cell is the combination of the threshold voltage of a selector and a switching voltage of the memristor or other memory device to which it is coupled. The voltage range between the threshold voltage of the selector and the write voltage of the memory cell may be the appropriate range for a read voltage, which may be applied to determine the state of the memory cell. However, due to variations in the geometry and variations in the composition of the components due to fabrication processes, some variation in the threshold voltage of the selector and variation in the write voltage of the memory cell may result. When these variations are large, the ranges of the threshold voltage of the selectors in the array and the write voltages of the memory cells may overlap, leaving no suitable range for the read voltage.

Examples disclosed herein provide for memory controllers to determine the state of a memory cell in a crossbar array. In example implementations, memory controllers have a voltage driver and a voltage comparator. The voltage driver applies a variable voltage to a selected line of a crossbar array to determine a first measured voltage that drives a first read current through a selected memory cell of the crossbar array and to determine a second measured voltage that drives a second read current through the selected memory cell. The voltage comparator determines a voltage difference between the first measured voltage and the second measured voltage and compares the voltage difference with a reference voltage difference.

In this manner, the state of the memory cell may be determined by comparing the difference between the two measured voltages and the reference voltage difference. For example, the voltage difference may be larger than a reference voltage difference when the memory cell is in its high resistance state. The voltage difference may be smaller than a reference voltage difference when the memory cell is in its low resistance state.

Figure 1:
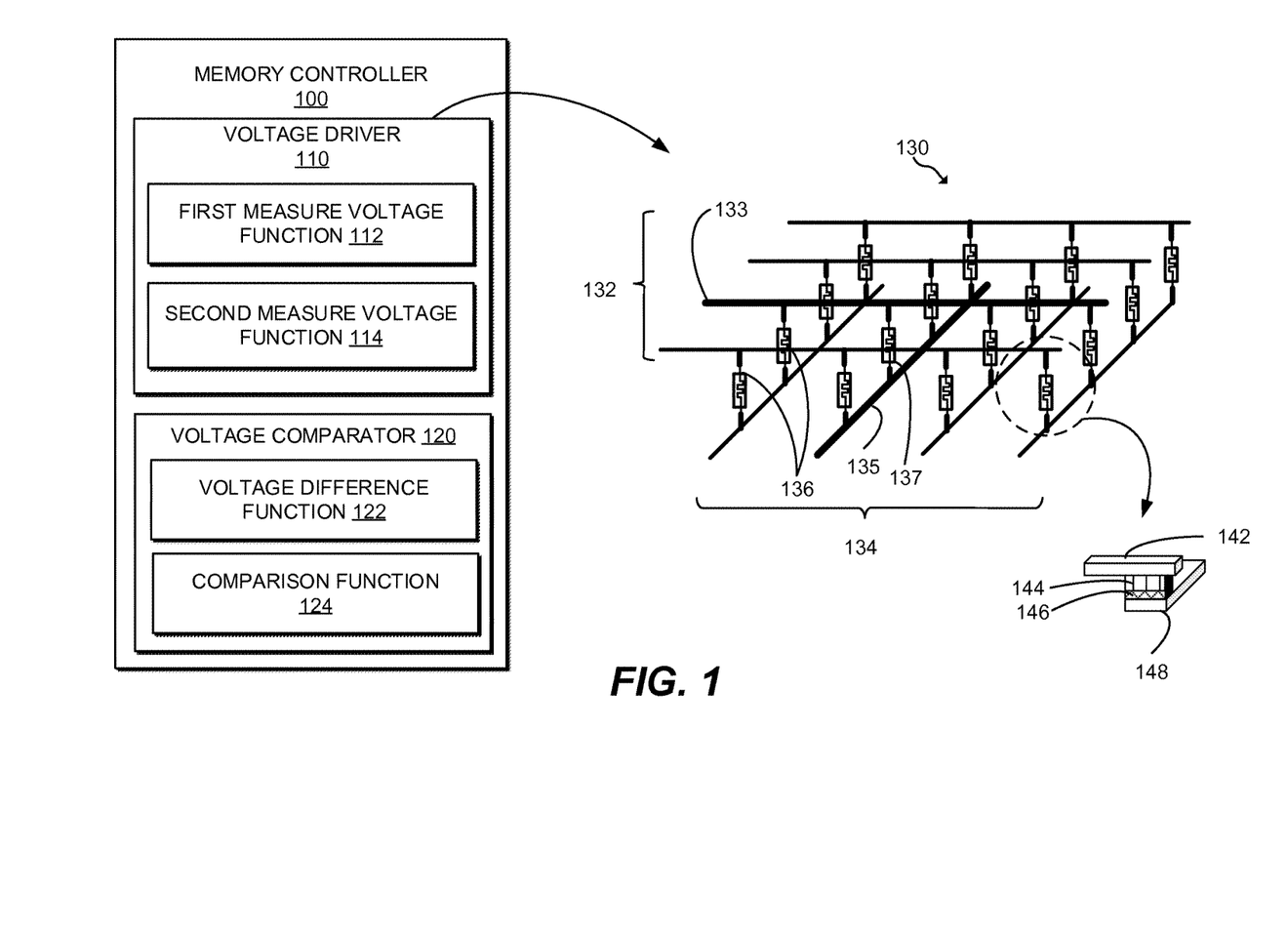
FIG. 1 is a block diagram of an example memory controller to determine the state of a memory cell in a crossbar array and a schematic of an example crossbar array.

Referring now to the drawings, FIG. 1 depicts an example memory controller 100 having a voltage driver 110 and a voltage comparator 120. Voltage driver 110 may have a first measured voltage function 112 for applying a variable voltage to a selected line of a crossbar array 130 to determine a first measured voltage that drive a first read current through a selected memory cell 137 of crossbar array 130 and a second measured voltage function 114 for applying the variable voltage to the selected line of crossbar array 130 to determine a second measured voltage that drives a second read current through selected memory cell 137. Voltage comparator 120 may have a voltage difference function 122 for determining a voltage difference between the first measured voltage and the second measured voltage and a comparison function 124 for comparing the voltage difference with a reference voltage difference to determine a state of selected memory cell 137.

Memory controller 100 may be an electrical device or component that, in addition to other functions, operates or controls a memory device. The implementation of memory controller 100 may include hardware-based components, such as a microchip, chipset, or electronic circuit, and software-driven components, such as a processor, microprocessor, or some other programmable device. For example, memory controller may include a circuit, such as the example circuit shown in FIG. 5.

Voltage driver 110 may be a module, engine, or device that, in addition to other functions, operates first measured voltage function 112 and second measured voltage function 114. The implementation of voltage driver 110 may include hardware-based components, such as a microchip, chipset, or electronic circuit, and software-driven components, such as a processor, microprocessor, or some other programmable device. Furthermore, voltage comparator 120 may be a module, engine, or device that, in addition to other functions, operates voltage difference function 122 and comparison function 124. The implementation of voltage comparator 120 may include hardware-based components, such as a microchip, chipset, or electronic circuit, and software-driven components, such as a processor, microprocessor, or some other programmable device. For example, voltage driver 110 and voltage comparator 120 may include circuits and components as part of the example circuit shown in FIG. 5.

Crossbar array 130 may be a configuration of parallel and perpendicular lines with memory cell and other components coupled between lines at cross-points. Such an architecture is generally referred to as a crossbar or cross-point array. Crossbar array 130 may include a plurality of row lines 132, a plurality of column lines 134, and a plurality of memory cells 136. Each memory cell 136 may be coupled between a unique combination of one row line 132 and one column line 134. In other words, no memory cells share both a row line and a column line. In examples herein, memory controller 100 may operate to determine the state of a selected memory cell 137 that is coupled between a selected row line 133 and a selected column line 135.

Row lines 132 may be electrically conducting lines that carry current throughout crossbar array 130. Row lines 132 may be in parallel to each other, generally with equal spacing. Row lines 132 may sometimes be referred to as bit lines. Depending on orientation, row lines 132 may alternatively be referred to as word lines. Similarly, column lines 134 may be conducting lines that run perpendicular to row lines 132. Column lines 134 may be referred to as word lines in some conventions. In other orientations, column lines 134 may refer to bit lines. Row lines 132 and column lines 134 may be made of conducting materials, such as platinum (Pt), tantalum (Ta), hafnium (Hf), zirconium (Zr), aluminum (Al), cobalt (Co), nickel (Ni), iron (Fe), niobium (Nb), molybdenum (Mo), tungsten (W), copper (Cu), titanium (Ti), tantalum nitrides ($TaN_x$), or titanium nitrides ($TiN_x$).

Memory cell 136 may be coupled between row lines 132 and column lines 134, which may mean forming a continuous electrical connection between a row line 132, a memory cell 136, and a column line 134. In some examples, a memory cell 136 may be an electrical component that may change resistance when a voltage is applied across it or a current is driven through it. Furthermore, a memory cell 136 may "memorize" its last resistance. In this manner, each memory cell 136 may be set to at least two states. A memory cell 136 may switch from a first state to a second state when a write voltage is applied to the memory cell 136. In some examples, the write voltage is the minimum voltage that need be applied to drive a current above a switching current that switches the memory cell 136. In some examples, memory cell 136 may include one or more of a memristor, a phase change memory, spin-transfer torque memory, or other forms of memory.

In some examples, each memory cell 136 may include a memristor, which may provide the switching and memorizing properties discussed above. Memristors may be based on a variety of materials. Each memristor may be oxide-based, meaning that at least a portion of the memristor is formed from an oxide-containing material. Each memristor may also be nitride-based, meaning that at least a portion of the memristor is formed from a nitride-containing composition. Furthermore, each memristor may be oxy-nitride based, meaning that a portion of the memristor is formed from an oxide-containing material and that a portion of the memristor is formed from a nitride-containing material. In some examples, a memristor may be formed based on tantalum oxide ($TaO_x$) or hafnium oxide ($HfO_x$) compositions. Other example materials of memristors may include titanium oxide, yttrium oxide, niobium oxide, zirconium oxide, aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, and silicon nitride. In addition, other functioning memristors may be employed in the practice of the teachings herein.

A memristor may have be a non-linear memristor exhibiting current-voltage nonlinearity in a voltage range of interest. In other words, when a voltage applied across memristor is changed, the current passing through the memristor changes disproportionately to the change in voltage. For example, a memristor may exhibit I-V in the typical voltage range for the operation of voltage driver 110. In some examples, the factor by which the memristor is non-linear may be a function of voltage, where the factor may be different in different voltage ranges.

Alternatively or in addition, each memory cell 136 may include a selector coupled in series with a memristor. A selector may be an electrical component placed in series with other components, such as a memristor, that controls the overall electrical properties of the resulting combination device. In some examples, a selector may be nonlinear, which may mean that a certain change in voltage applied across the selector may drive a disproportional change in the current passing through the selector. Alternatively or in addition, a selector may exhibit insulator-to-conductor transition in certain voltage ranges. In other words, a selector may switch from behaving as an insulator to behaving as a conductor when a voltage greater than a threshold voltage is applied. Correspondingly, the selector may behave as an insulator when a voltage less than a threshold voltage is applied or if no voltage is applied. Various selectors may be suitable for the implementations described herein. For example, selectors may be based on oxides, nitrides, oxynitrides, sulfides, selenides, tellurides, arsenides, and antimonides.

In the magnified view of a memory cell 136, a row line is labeled 142, a memristor is labeled 144, a selector is labeled 146, and a column line is labeled 148. The magnified view illustrated the memristor 144 coupled in series with a selector 146. Memristor 144 and selector 146 make up a memory cell coupled between row line 142 and column line 148.

Continuing to refer to FIG. 1, voltage driver 110 may operate first measured voltage function 112 and second measured voltage function 114. First measured voltage function 112 may apply a variable voltage to a selected line of crossbar array 130 to determine a first measured voltage that drives a first read current through selected memory cell 137. For example, first measured voltage function 112 may alter a voltage applied to selected row line 133 until a predetermined first read current is passing through selected memory cell 137. The voltage at which this occurs may be recorded as the first measured voltage. Alternatively, the variable voltage may be applied to selected column line 135 depending on orientation of the crossbar array and surrounding circuitry. Similarly, second measured voltage function 114 may determine a second measured voltage. The second read current may be either larger or smaller than the first read current, which may result in a second measured voltage that is different than the first measured voltage.

Voltage comparator 120 may operate voltage difference function 122 and comparison function 124. Voltage difference function 122 may determine a voltage difference between a first measured voltage determined by first measured voltage function 112 and a second measured voltage determined by second measured voltage function 114. The voltage difference may be the change in the voltage associated with a resulting change in current through selected memory cell 137. Subsequently, comparison function 124 may compare the voltage difference determined by voltage difference function 122 with a reference voltage difference to determine a state of selected memory cell 137, such as, for example, a relatively high resistance state or a relatively low resistance state. When the first read current is kept constant and the second read current is kept constant, the voltage difference between the first measured voltage and the second measured voltage varies depending on the resistance of selected memory cell 137. For example, the voltage difference may be large when the resistance of memory cell 137 is high, such as when the memory cell is in an insulating state, which may be referred to an "off" state. Alternatively, the voltage difference may be small when the resistance of selected memory cell 137 is low, such as when the memory cell is in a conducting, "on", state. Therefore, when the voltage difference is higher than a predetermined reference voltage difference, the selected memory cell 137 may be in its high resistance state, and selected memory cell 137 may be in its low resistance state when the voltage difference is lower than the reference voltage difference. The reference voltage difference may be predetermined according to the type, geometry, and/or materials present in the memory cell being read.

In some implementations, voltage driver 110 may include a function for driving a current through all unselected memory cells 136 of crossbar array 130, where the current is lower than the current driven through the selected memory cell 136. In some examples, the current may be driven through the unselected memory cells to help neutralize currents from the voltages applied to the selected lines, such as selected row line 133 and selected column line 135. The current through the unselected memory cells may reduce sneak currents through unselected lines, due to the equipotential effect, to levels below that needed to unintentionally read or write unselected memory cells 136.

Furthermore in some examples, memory controller 100 may determine a sneak current. Sneak currents may be unwanted currents that creep through unselected memory cells 136 that share a line with a selected memory cell 137. For example, when a current is applied, or a voltage is applied to drive a current, to selected row line 133, current may sneak from selected row line 133 through memory cells 136 that are not selected memory cell 137. Sneak currents, among other effects, may complicate reading and writing of selected memristors. Memory controller 100 may determine a sneak current before the operation of voltage driver 110 and voltage comparator 120. By doing so, memory controller 100 may account for the sneak currents, and voltage driver 110 may determine a more accurate first measured voltage and a more accurate second measured voltage. For example, the sneak current is subtracted from the first read current before the determination of the first measured voltage, and the sneak current is subtracted from the second read current before the determination of the second measured voltage.

Alternatively or in addition, sneak currents may be included in the first read current and the second read current. When the sneak currents are constant and small relative to the read currents, the inclusion of the sneak currents in the read currents may not significantly impact determination of the measured voltages. In other words, in such examples, the sneak currents may not consequentially affect the operation of memory controller 100 to determine the state of a selected memory cell 137.

Figure 2:
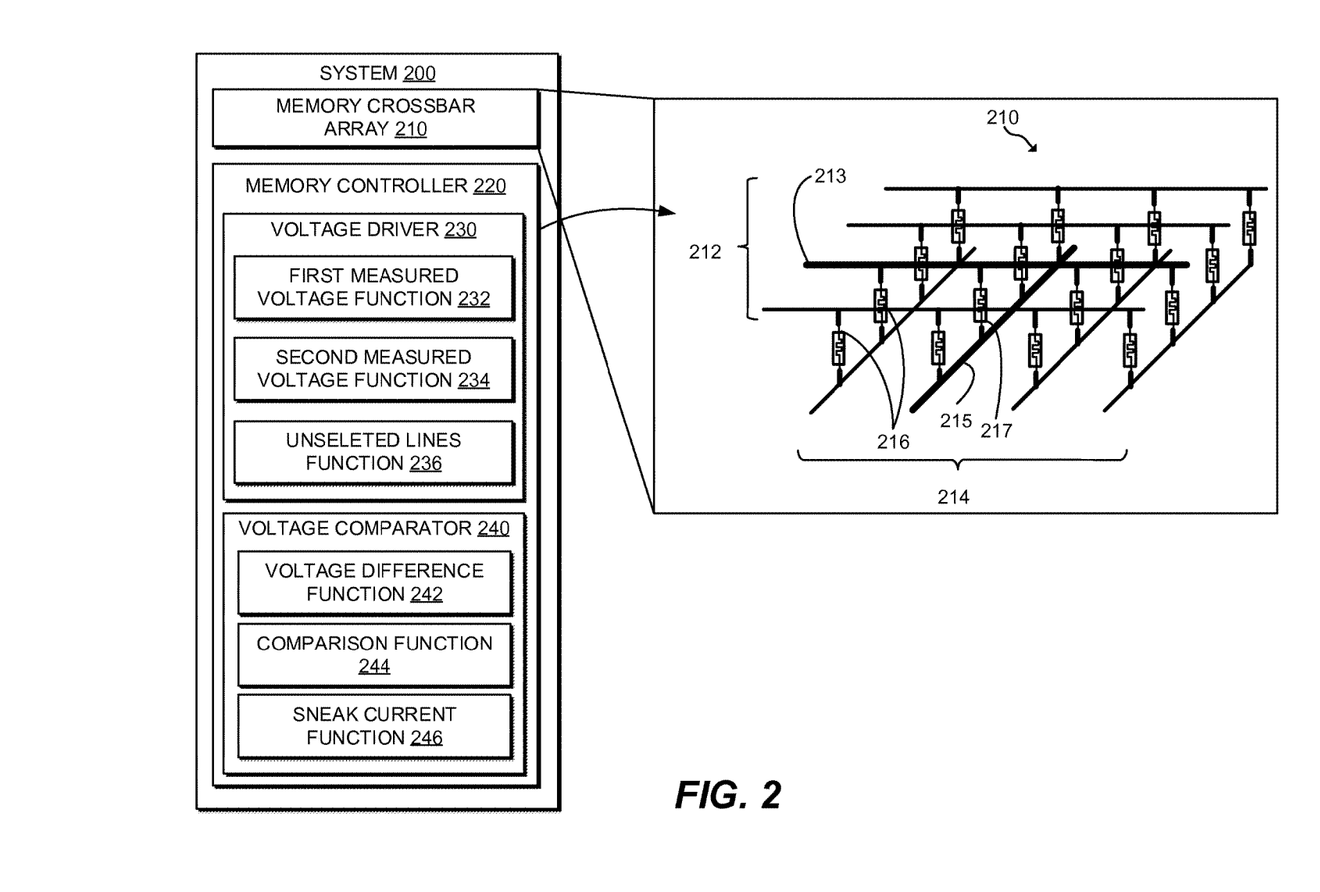
FIG. 2 is a block diagram of an example system having a memory controller to determine the state of a memory cell in a crossbar array and a schematic of an example crossbar array.

FIG. 2 depicts an example system 200 having a memory controller 220 for determining the state of a selected memory cell in a memory crossbar array 210. System 200 may be a set or combination of components that forms an integrated whole. For example, system 200 may be a computing device or parts of a computing device, such as a memory device or unit. In an example implementation, system 200 is a memory device having a memory crossbar array 210 and surrounding circuitry that make up memory controller 220.

Memory crossbar array 210 may have a plurality of row lines 212, a plurality of column lines 214, and a plurality of memory cells 216. Each memory cell 216 may be coupled between a unique combination of one row line 212 and one column line 214. As described in relation to FIG. 1 for crossbar array 130, memory crossbar array 210 may be a configuration of parallel and perpendicular lines with memory cells 216 coupled between lines at cross-points. Memory cells 216 may include a nonlinear memristor or a memristor coupled in series with a selector and may be coupled between a unique combination of a row line 213 of plurality of row lines 212 and a column line 215 of plurality of column lines 214. As described above, the components of crossbar array 210 may include a variety of materials and examples.

Memory controller 220 may have a voltage driver 230 and a voltage comparator 240. Similar to memory controller 100 of FIG. 1, memory controller 220 may be an electrical device for component that, in addition to other functions, operate or controls a memory device, such as memory crossbar array 210. Like voltage driver 110 of FIG. 1, voltage driver 230 may be a module, engine, or device that, in addition to other functions, operates first measured voltage function 232, second measured voltage function 234, and unselected lines function 236. In some examples, voltage driver 230 may include circuits and components as part of the example circuit of FIG. 5.

First measured voltage function 232 may apply a variable voltage to a selected line of memory crossbar array 210 to determine a first measured voltage that drives a first read current through selected memory cell 217. Similarly, second measured voltage function 234 may determine a second measured voltage. The second read current may be either larger or smaller than the first read current, which may result in a second measured voltage that is different than a first measured voltage.

Unselected lines function 236 may drive a current through all unselected memory cells 216 of crossbar array 210, where the current is lower than the current driven through the selected memory cell 217. In some examples, the current may be driven through the unselected memory cells to help neutralize currents from the voltages applied to the selected lines, such as selected row line 213 and selected column line 215. The current through the unselected memory cells may reduce sneak currents through unselected lines, due to the equipotential effect, to levels below that needed to unintentionally read or write unselected memory cells 216.

Voltage comparator 240 may be a module, engine, or device that, in addition to other functions, operates voltage difference function 242, comparison function 244, and sneak current function 246. In some examples, voltage comparator 240 may include circuits and components as part of the example circuit shown in FIG. 5. Voltage difference function 242 may determine a voltage difference between a first measured voltage determined by first measured voltage function 232 and a second measured voltage determined by second measured voltage function 234. Subsequently, comparison function 244 may compare the voltage difference determined by voltage difference function 242 with a reference voltage difference to determine a state of selected memory cell 217, such as, for example, a relatively high resistance state or a relatively low resistance state. When the first read current is kept constant and the second read current is kept constant, the voltage difference between the first measured voltage and the second measured voltage varies depending on the resistance of the memristor of selected memory cell 217. For example, the voltage difference may be large when the resistance is high, such as when the memristor is in an insulating state, which may be referred to an "off" state. Alternatively, the voltage difference may be small when the resistance is low, such as when the memristor is in a conducting, "on", state. Therefore, when the voltage difference is higher than a predetermined reference voltage difference, selected memory cell 217 may be in one state, and selected memory cell 217 may be in another state when the voltage difference is lower than the reference voltage difference.

Sneak current function 246 may determine sneak currents. Sneak currents may be unwanted currents that creep through unselected memory cells 216 that share a line with a selected memory cell 217. Memory controller 220 may determine a sneak current before the operation of voltage driver 230 and voltage comparator 240. By doing so, memory controller 220 may account for the sneak currents, and voltage driver 230 may determine a more accurate first measured voltage and a more accurate second measured voltage. For example, the sneak current is subtracted from the first read current before the determination of the first measured voltage, and the sneak current is subtracted from the second read current before the determination of the second measured voltage.

Alternatively or in addition, sneak currents may be included in the first read current and the second read current. When the sneak currents are constant and small relative to the read currents, the inclusion of the sneak currents in the read currents may not significantly impact determination of the measured voltages. In other words, in such examples, the sneak currents may not affect the operation of memory controller 220 to determine the state of a selected memory cell 217.

Figure 3:
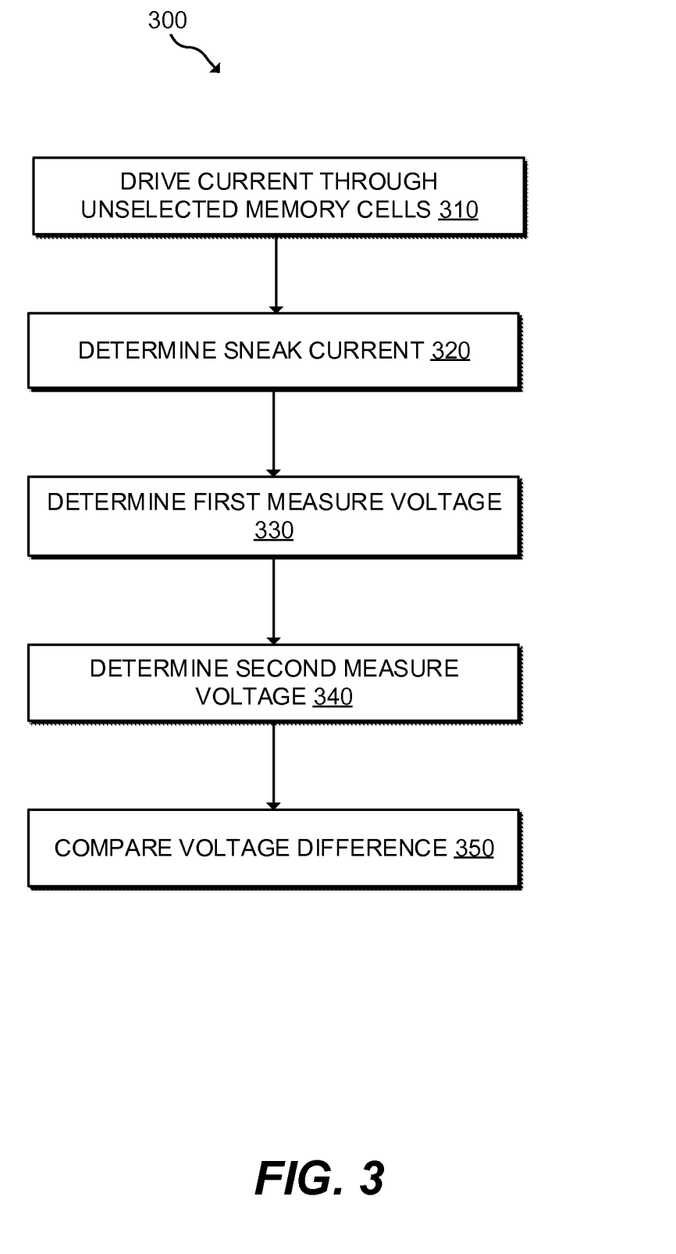
FIG. 3 is a flowchart of an example method for determining the state of a memory cell in a crossbar array.

FIG. 3 is a flowchart depicting an example method 300 for determining the state of a memory cell in a crossbar array, which may include block 310 for applying a voltage to unselected lines of the crossbar array, block 320 for determining a sneak current, block 330 for determining a first measured voltage, block 340 for determining a second measured voltage, and block 350 for comparing the voltage difference with a reference voltage difference. Although execution of method 300 is herein described in reference to determining the state of a selected memory cell 137 of crossbar array 134 of FIG. 1, other suitable parties for implementation of method 300 should be apparent, including, but not limited to, system 200 of FIG. 2.

Method 300 may start in block 310, where a current, which is lower than the current to be driven through the selected memory cell 137, may be driven through all unselected memory cells of crossbar array 130. In some examples, the current may be driven through the unselected memory cells to help neutralize currents from the voltages applied to the selected lines, such as selected row line 133 and selected column line 135. The current through the unselected memory cells may reduce sneak currents through unselected lines, due to the equipotential effect, to levels below that needed to unintentionally read or write unselected memory cells 136.

After driving a current through the unselected memory cells, method 300 may proceed to block 320, where a sneak current is determined. As descried above, sneak currents may be unwanted currents that may affect the current levels through selected memory cell 137. The operation of block 320 may allow memory controller 100 to account for the sneak currents, and a more accurate determination of the state of selected memory cell 137 may be made in subsequent blocks of method 300. Alternatively or in addition, sneak currents may be included in the first read current and the second read current.

Method 300 may then proceed to block 330, where a first measured voltage is determined. An example implementation of block 330 may include first measured voltage function 112 applying a variable voltage to a selected line of crossbar array 130 to determine a first measured voltage that drives a first read current through selected memory cell 137. Alternatively, the variable voltage may be applied to selected column line 135 depending on orientation of the crossbar array and surrounding circuitry Method 300 may then proceed to block 340, where a second measured voltage is determined. An example implementation of block 340 may include second measured voltage function 114 applying a variable voltage to a selected line of crossbar array 130 to determine a second measured voltage that drives a second read current through selected memory cell 137. For example, second measured voltage function 114 may alter a voltage applied to selected row line 133 until a predetermined second read current is passing through selected memory cell 137. Similar to in block 330, the voltage at which this occurs may be recorded as the second measured voltage.

After determining the measured voltages, method 300 may proceed to block 350, where the voltage difference between the first measured voltage identified in block 330 and the second measured voltage identified in block 340 is compared with a reference voltage difference. An example implementation of block 340 may include the operation of voltage difference function 122 and comparison function 124. Voltage difference function 122 may determine a voltage difference between a first measured voltage identified in block 330 and a second measured voltage identified in block 340. The voltage difference may be the change in the voltage associated with a resulting change in current through selected memory cell 137. Subsequently, comparison function 124 may compare the voltage difference identified by voltage difference function 122 with a reference voltage difference to determine a state of selected memory cell 137, such as, for example, a relatively high resistance state or a relatively low resistance state.

Figure 4:
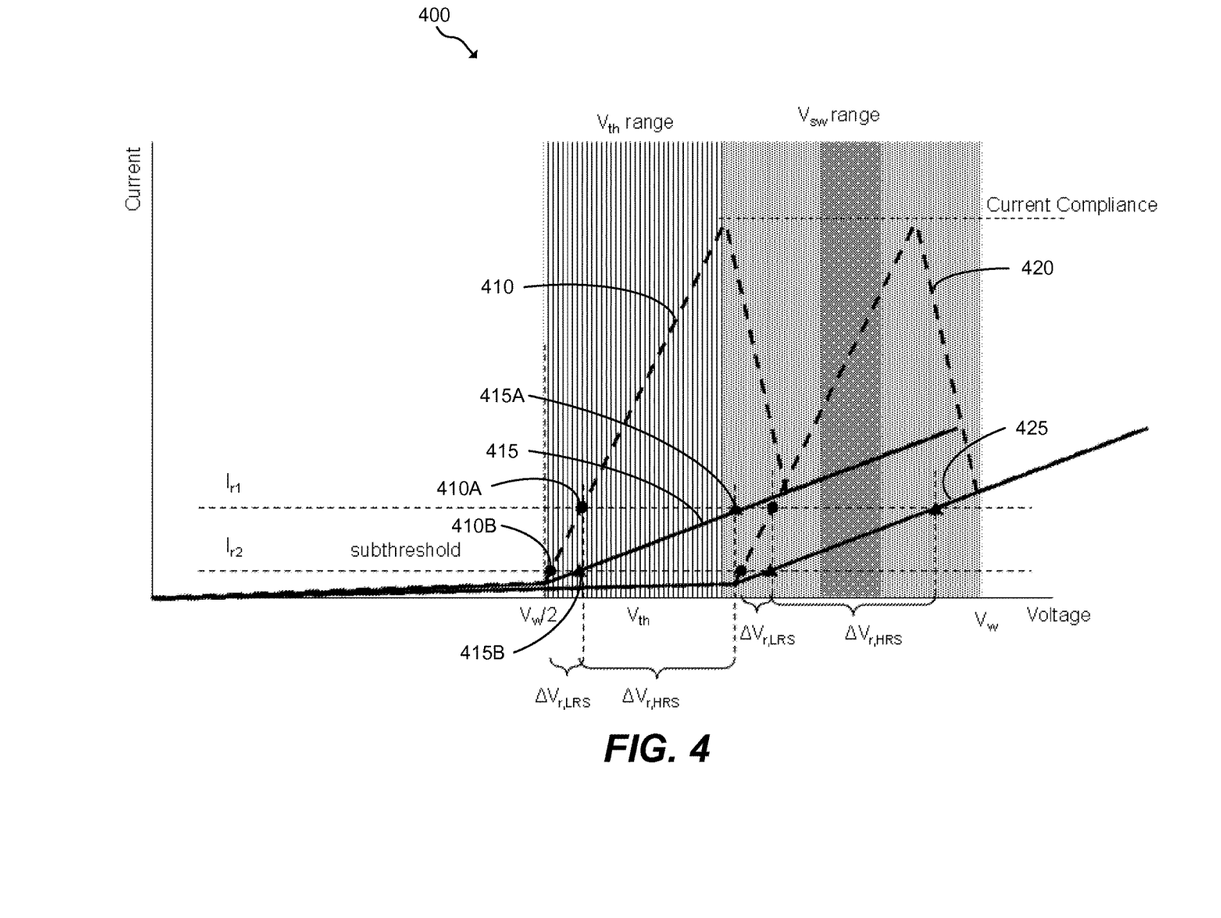
FIG. 4, on coordinates of current and voltage, is an example I-V plot showing the operation of the example system of FIG. 2.

FIG. 4 is, on coordinates of current and voltage, is an example I-V plot 400 showing the operation of example system 200 of FIG. 2. It should be noted that FIG. 4 may alternatively, or in addition, illustrate the operation of memory controller 100 of FIG. 1. Plot 400 shows the I-V characteristics of two different memory cells during a read operation, such as by the implementation of example method 300. The I-V characteristics of the first memory cell are depicted as 410 and 415, which respectively represent the behavior of the first memory cell in a low resistance state and in a high resistance state. The I-V characteristics of the second memory cell are depicted as 420 and 425, which respectively represent the behavior of the second memory cell in a low resistance state and in a high resistance state.

To determine the state of the first memory cell, a memory controller such as memory controller 220 may, via first measured voltage function 232, apply a variable voltage to determine a first measured voltage, which is 410A when the first memory cell is in the low resistance state and 415A when it is in the high resistance state. Memory controller 220 may then, via second voltage function 234, apply the variable voltage to determine a second measured voltage, which is 410B when the first memory cell is in the low resistance state and 415B when it is in the high resistance state.

The voltage difference determined by voltage difference 242 may be the difference between the two measured voltages. When the first memory cell is in the high resistance state, the voltage difference is large and is represented by $\Delta V_{r,HRS}$. When the first memory cell is in the low resistance state, the voltage difference is small and is represented by $\Delta V_{r,LRS}$. Comparing these voltage differences with a reference voltage differences may provide indication the state of the first memory cell.

Because of the utilization of two measured voltages that are determined by matching a variable voltage to read currents, no current larger than a switching current level is applied to the memory cell, which prevents inadvertent writing of the memory cell. Furthermore, memory controllers such as memory controller 100 and memory controller 220 may determine the state of memory cells within a crossbar array in spite of variation in the threshold voltage of the selector and variation in the write voltage of the memory cell as discussed above.

$V_w$ represents the largest write voltage of the memory cells of the crossbar array 210, while $V_{sw}$ shows the range of the write (switching) voltages of the memory cells of the array. $V_{th}$ meanwhile shows the range of the threshold voltages of the selectors of crossbar array 210. In some implementations, as explained above, a voltage less than the smallest of the threshold voltages of the selectors. As described above, that voltage may be $V_w/2$ in some examples, which is half of the write voltage.

Figure 5:
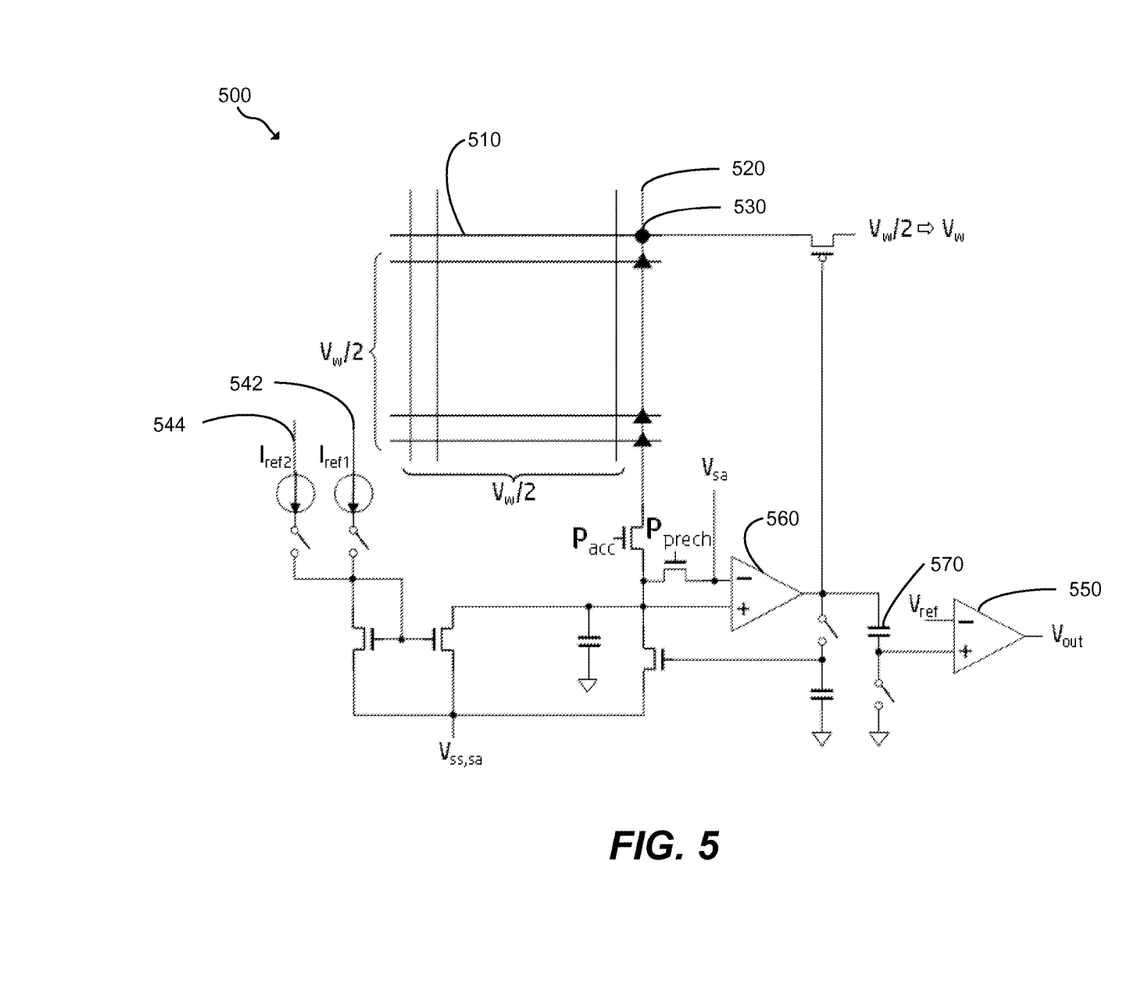
FIG. 5 is an example circuit of an example memory controller.

FIG. 5 is an example circuit 500 of an example memory controller, such as memory controller 100 of FIG. 1 or memory controller 220 of FIG. 2. In circuit 500, a selected row line is labeled 510, and a selected column line is 520. The selected memory cell is shown as 530. In some implementations, the accompanying lines and circuit components may operate to implement the functions of the memory controller, such as voltage driver 110 and voltage comparator 120 of memory controller 100 and such as voltage driver 230 and voltage comparator 240 of the memory controller 220 of system 200. It should be noted that various circuits, devices, and configurations may be utilized to implement memory controller 100 and that circuit 500 is an example implementation.

Circuit 500 may have first read current driver 542 and second read current driver 544 that drives a first read current and a second read current, respectively. The first read current and the second read current are held stable by the accompanying circuitry so that a first measured voltage and a second measured voltage may be determined by applying a variable voltage to drive a current to match the first read current and the second read current, which may be the outputs of operational amplifier 560. A voltage difference may be determined by first storing the first measured voltage on capacitor 570 and the finding the voltage difference against the second measured voltage. Comparator 550 may then compare the voltage difference with a reference voltage difference to determine a state of the selected memory cell 530.

The foregoing describes a number of examples for memory controllers. It should be understood that the memory controllers described herein may include additional components and that some of the components described herein may be removed or modified without departing from the scope of the memristors or their applications. It should also be understood that the components depicted in the figures are not drawn to scale and thus, the components may have different relative sizes with respect to each other than as shown in the figures.

What is claimed is:

1. A memory controller, comprising:
   a voltage driver to:
      apply a variable voltage to a selected line of a crossbar array to determine a first measured voltage that drives a first read current through a selected memory cell of the crossbar array, wherein the crossbar array comprises a plurality of row lines, a plurality of column lines, and a plurality of memory cells, wherein each memory cell is coupled between a unique combination of one row line and one column line; and
      apply the variable voltage to the selected line to determine a second measured voltage that drives a second read current through the selected memory cell; and
   a voltage comparator to determine a voltage difference between the first measured voltage and the second measured voltage and to compare the voltage difference with a reference voltage difference to determine a state of the selected memory cell.

2. The memory controller of claim 1, wherein each memory cell comprises a non-linear memristor, wherein each non-linear memristor exhibits non-linear current-voltage behavior in a voltage range of interest.

3. The memory controller of claim 1, wherein each memory cell comprises a memristor coupled in series with a selector.

4. The memory controller of claim 3, wherein a selector of the plurality of selectors switches from an insulating state to a conducting state when a voltage larger than a threshold voltage is applied to the selector.

5. The memory controller of claim 3, wherein the selector exhibits non-linear current-voltage behavior in a voltage range of interest.

6. The memory controller of claim 1, wherein the voltage driver is to drive a current through each of the unselected memory cells connected to the selected line, wherein the current is lower than the current driven through the selected memory cell during the operation of the voltage driver.

7. The memory controller of claim 6, wherein the memory controller is to determine a sneak current.

8. The memory controller of claim 7, wherein the sneak current is subtracted from the first read current before the determination of the first measured voltage and wherein the sneak current is subtracted from the second read current before the determination of the second measured voltage.

9. A system, comprising:
a memory crossbar array, wherein the memory crossbar array comprises a plurality of row lines, a plurality of column lines, and a plurality of memory cells, wherein each memory cell is coupled between a unique combination of one row line and one column line; and
a memory controller, wherein the memory controller comprises:
a voltage driver to apply a variable voltage to a selected line of the memory crossbar array to determine a first measured voltage that drives a first read current through a selected memory cell and to apply the variable voltage to the selected line to determine a second measured voltage that drives a second read current through the selected memory cell; and
a voltage comparator to determine a, voltage difference between the first measured voltage and the second measured voltage and to compare the voltage difference with a reference voltage difference to determine the state of the selected memory cell.

10. The system of claim 9, wherein each memory cell comprises a non-linear memristor, wherein each non-linear memristor exhibits non-linear current-voltage behavior in a voltage range of interest.

11. The system of claim 9, wherein each memory cell comprises a memristor coupled in series with a selector.

12. The system of claim 9, wherein: the voltage driver is to drive current through each of the unselected memory cells connected to the selected line, wherein the current is lower than the current driven through the selected memory cell during the operation of the voltage driver; and the voltage comparator is to determine a sneak current.

13. The system of claim 12, wherein the sneak current is subtracted from the first read current before the determination of the first measured voltage and wherein the sneak current is subtracted from the second read current before the determination of the second measured voltage.

14. A method for determining a state of a memristor, comprising:
determining a first measured voltage that drives a first read current through a selected memory cell of a crossbar array by applying a variable voltage to a selected line of the crossbar array; determining a second measured voltage that drives a second read current through the selected memory cell by applying the variable voltage to the selected line; and
comparing a voltage difference between the first measured voltage and the second measured voltage with a reference voltage difference,
wherein the crossbar array comprises a plurality of row lines, a plurality of column lines, and a plurality of memory cells coupled between a unique combination of one row line and one column line.

15. The method of claim 14, comprising: driving a current through each of the unselected memory cells connected to the selected line, wherein the current is lower than the current driven through the selected memory cell during the operation of the voltage driver; and determining a sneak current.

16. The memory controller of claim 1, wherein, when the voltage difference is larger than the reference voltage difference, the controller determines the selected memory cell to be in a high resistance state.

17. The memory controller of claim 1, wherein, when the voltage difference is less than the reference voltage difference, the controller determines the selected memory cell to be in a low resistance state.

18. The memory controller of claim 3, wherein the selector comprises one of an oxide and a nitride.

19. The memory controller of claim 1, comprising an operational amplifier to apply the variable voltage, wherein the variable voltage is to drive a current matching the first or second read current.

20. The memory controller of claim 1, wherein the voltage comparator comprises a capacitor to store the first measured voltage.

* * * * *